United States Patent
Nguyen (10) Patent No.: US 7,668,270 B2
(45) Date of Patent: Feb. 23, 2010

(54) METHOD AND SYSTEM FOR PROGRAMMABLE FILTERING OFFSET

(75) Inventor: Ut T. Nguyen, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 508 days.

(21) Appl. No.: 11/313,531

(22) Filed: Dec. 20, 2005

(65) Prior Publication Data
US 2007/0140390 A1 Jun. 21, 2007

(51) Int. Cl.
*H04B 1/10* (2006.01)
(52) U.S. Cl. ..................................... 375/350
(58) Field of Classification Search ............ 375/240.26, 375/240.29, 350
See application file for complete search history.

(56) References Cited

U.S. PATENT DOCUMENTS

| | | | | |
|---|---|---|---|---|
| 6,424,825 B1 * | 7/2002 | Ecklund et al. | ............. | 455/205 |
| 6,650,710 B1 * | 11/2003 | Hamery et al. | ......... | 375/240.29 |
| 6,895,020 B2 * | 5/2005 | Morris et al. | ............... | 370/474 |
| 2003/0007568 A1 * | 1/2003 | Hamery et al. | ......... | 375/240.26 |

* cited by examiner

*Primary Examiner*—Khanh C Tran
(74) *Attorney, Agent, or Firm*—McAndrews, Held & Malloy, Ltd.

(57) ABSTRACT

Methods and systems for a programmable filtering offset may include filtering desired data located at a variable offset from a start of a particular message in a data stream using a programmable hardware filter module. The variable offset may be specified in bits or bytes. The programmable hardware filter module may start filtering from an offset corresponding to the start of the desired data. The programmable hardware filter module may be a variable length filter or a fixed length filter. An offset from the start of a particular message may be determined, where the desired data that may be compared may start after the offset from the beginning of the message. The programmable hardware filter module may be configured with the determined offset.

30 Claims, 7 Drawing Sheets

METHOD AND SYSTEM FOR PROGRAMMABLE FILTERING OFFSET

CROSS-REFERENCE TO RELATED APPLICATIONS/INCORPORATION BY REFERENCE

This application makes reference to: U.S. patent application Ser. No. 11/015,445 filed Dec. 17, 2004, now became U.S. Pat. No. 7,388,871; and U.S. patent application Ser. No. 11/313,877 filed Dec. 20, 2005.

All of the above stated applications are hereby incorporated herein by reference in their entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to processing data packets. More specifically, certain embodiments of the invention relate to a method and system for a programmable filtering offset.

BACKGROUND OF THE INVENTION

The introduction of broadband networks, access devices such as set-top boxes, and media such as DVD disks recorded with digitally compressed audio, video and data signals, for example, which utilize motion picture expert group (MPEG) compression protocols, may provide sound and picture quality that is virtually indistinguishable from the original material. One commonly used MPEG protocol is MPEG-2, which provides the necessary protocols and infrastructure necessary for transferring digitally compressed audio, video and data signals. A detailed description of the MPEG-2 standard is available in the ISO/IEC Standard 13818.

A file compressed, or encoded, via MPEG protocol may comprise a plurality of data streams. These data streams may include an elementary stream (ES), a packetized elementary stream (PES), a transport stream (TS) and a program specific information stream. A MPEG encoder typically creates an elementary stream from analog video or analog audio contents. Therefore, there may be at least two elementary streams generated from a program with audio and video content. The MPEG encoder may apply MPEG compression algorithms to the source content, resulting in individual elementary streams for each audio and video stream. The encoded MPEG data stream may be communicated to a subscriber who may use a set-top box, for example, to uncompress, or decode, the MPEG data stream for viewing on a TV. Factors such as a bit rate of the encoded stream, quality of the original source content, and encoder algorithm may determine the quality of the output signal.

In a typical MPEG data stream, the length of the individual elementary streams may be equivalent to the length of the program. The data in each elementary stream may be converted to a plurality of variable-length packets. These packets may be called the packetized elementary stream (PES). The packets in each PES may include a header that may be prepended to a payload. The header may include information pertaining to the encoding process required by the MPEG decoder to decompress and decode a received elementary stream. Each individual elementary stream may have a corresponding PES and encoded audio and video information may still reside in separate PESs.

The transport stream (TS) and program specific information stream may be formed by multiplexing a plurality of PES packets. The TS may include a plurality of additional packets that may contain tables, which may be necessary for de-multiplexing the TS. The tables may be collectively called program specific information (PSI). To maintain synchronization and timing, null packets may also be inserted to fill the intervals between information-bearing packets. Timing information for an associated program may be carried by specific packets. One type of timing information may be called the program clock reference (PCR). The PCR may be located in one of the optional fields of the header for the TS packet. During operation, the PCR may permit the decoder to synchronize its clock to the same frequency as that of the original encoder's clock frequency. TS packets may have a fixed length of 188 bytes, which may include a header having a minimum size of 4 bytes and a maximum payload of 184 bytes.

A typical set-top box for a cable or satellite subscriber may receive tens, if not hundreds, of channels of programming information. Each channel may have associated with it a plurality of data streams. Therefore, a set-top box may use a filtering system to be able to quickly determine which data stream each packet may be associated with. Some systems utilize sophisticated software programs to filter contents for particular channels in a the plurality of data streams. As the number of channels in each data streams increases, the greater the complexity of these filters. Furthermore, as the number of data streams increases, even more sophisticated filters are required. As a result, the filters can overload a processor utilizing processing valuable processing bandwidth.

In current systems, filters are aligned from the start of a packet. Depending on the length of the filter and the location of the desired data in the packet, the filter may not be able to filter some of the desired data in the packet. Whenever this occurs, the processor may have to filter an unfiltered portion of the packet in order to complete filtering all of the desired data. This may increase the computational burden on the processor and may increase latency for real time operations.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for a programmable filtering offset, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a programmable filtering offset. Aspects of the method may comprise filtering desired data located at a variable offset from a start of a particular message in a data stream using a programmable hardware filter module. The variable offset may be specified in bits or bytes. The programmable hardware filter module may start filtering from an offset corresponding to the start of the desired data. The programmable hardware filter module may be a variable length filter or a fixed length filter. An offset from the start of a particular message may be determined, where the desired data that may be compared may start after the offset from the beginning of the message. The programmable hardware filter module may be configured with the determined offset.

Some systems may use hardware to offload various filtering tasks from a processor that normally handles filtering operations. The hardware may compare portions of the data in the packets with a bit-pattern from the beginning of the message since the data to be compared may typically start at the beginning of the message. However, in some cases, the data that is to be compared may not be located at a beginning of the message. In such cases, the filter may not be big enough to handle all of the data from the beginning of the packet to the data to be filtered. Accordingly, the filter may not filter some desired portions of the data. In such cases, the processor may have to filter the unfiltered portion of the desired data. This may be an unwanted burden on the processor.

Figure 1:
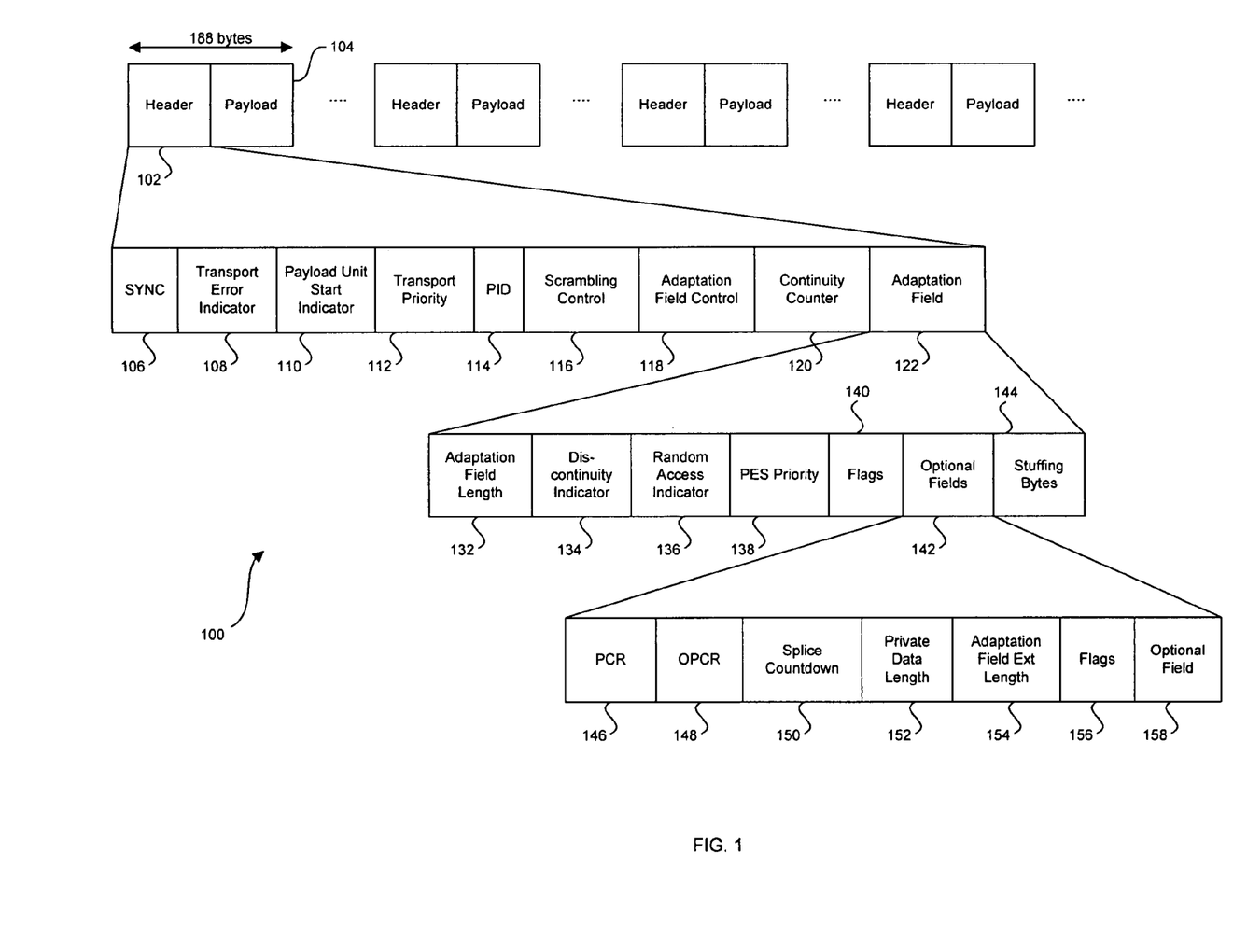
FIG. 1 is a diagram of the structure for an exemplary MPEG transport stream, which may be utilized in connection with an embodiment of the invention.

FIG. 1 is a diagram of the structure for an exemplary MPEG transport stream, which may be utilized in connection with an embodiment of the invention. Referring to FIG. 1, transport packets 100 may comprise a header 102 and a payload 104. The transport packets 100 may be a part of the transport stream (TS). The header 102 may be at least 4-bytes in length, and may comprise the following fields: synchronization (SYNC) 106, transport error indicator 108, payload unit start indicator 110, transport priority 112, packet ID (PID) 114, transport scrambling control 116, adaptation field control 118, continuity counter 120, and an optional adaptation field 122. The adaptation field, if present, may be a variable length field. The adaptation field 122 may further comprise the following fields: adaptation field length 132, discontinuity indicator 134, random access indicator 136, PES priority 138, flags 140, optional fields 142, and stuffing bytes 144. The optional fields 142 may further comprise the following: program clock reference (PCR) 146, OPCR 148, a splice countdown 150, private data length 152, adaptation field extension length 154, flags 156 and optional field 158. The payload 104 may comprise portions of data from the PES.

The SYNC byte 106 may be used to delineate the beginning and ending of TS packet 100. The transport error indicator 108 may indicate when there is an error in a packet or block. This may be particularly useful for error block testing. PID 114 may be a unique identifier that may identify every video and audio streams. The PID 114 may be used for identifying a channel and may comprise any information required for locating, identifying and reconstructing programs. Some PIDs may be reserved for specific uses by the MPEG protocol. The PID values may be stored in program specific information (PSI) tables. The PSI tables may be used to de-multiplex the TS. In order to ensure that all the audio, video and data for a program are properly decoded, it may be critical to ensure that the PIDs are correctly assigned and that the PSI tables correspond with their associated audio and video streams.

The stuffing bytes 144 may be used when the payload has a length of less than 184 bytes. The stuffing bytes 144 may be inserted to bring the packet size to the required 188-byte length. The PCR 146 may comprise 42 bits, 9 bits of which may be incremented at 27 MHz and 33 bits that may be incremented at 90 kHz upon rollover of the 9 bits. The bits in the PCR 146 may provide program clock recovery information that may be utilized for synchronization. The PCR 146 may be used to provide a clock recovery mechanism for MPEG programs. A 27 MHz system time clock (STC) signal may typically be used for encoding MPEG signals. Decoding of the signal requires a clock that may be locked to the encoder's STC of 27 MHz. Notably, the PCR 146 may be utilized by the decoder to regenerate a local clock signal that is locked to the STC. Whenever a program is placed in the transport stream, a 27 MHz time stamp may be inserted into the PCR 146. When the signal is received by a decoder, the decoder may compare the value in the PCR 146 with the frequency of its local voltage controlled oscillator (VCO) and adjust the VCO to ensure that the VCO is locked to the frequency specified by the PCR 146. To ensure accuracy, the PCR 146 may be updated with the STC every about 100 ms.

The continuity counter (CC) 120 may be used to determine when packets are lost or repeated. It may comprise a 4-bit field, which may be repeatedly incremented from zero to 15 for each PID. Discontinuity counter 134 may permit a decoder to handle discontinuities in the transport stream. Discontinuity counter 134 may indicate a time base such as the PCR 146 and continuity counter 120 discontinuities. Random access indicator 136 may be configured to indicate whether the next PES packet in the PID stream contains a video-sequence header or the first byte of an audio frame. Splice countdown 150 may be configured to indicate the number packets of the same PID number to a splice point occurring at the start of PES packets.

Two or more MPEG transport streams (TS) may be multiplexed to form a multi-program TS. In a case where the TS may comprise a single MPEG TS, the output of the multiplexer may be called a single program TS (SPTS). Furthermore, a number of SPTSs may be multiplexed to create a multi-program TS. In some cases, the program may comprise one or more ESs that may have a similar time reference. This may occur, for example, in a movie that has video and its corresponding audio content.

The PSI may comprise a set of tables that may be part of TS. The tables in the PSI may be required while de-multiplexing the TS and for matching PIDs to their corresponding programs. Once the PIDs are matched to their corresponding programs, the TS may be decoded by assembling and decompressing program contents. Typically, in order to determine which audio and video PIDs contain the corresponding content for a particular program, a program map table (PMT) may be decoded. Each program may have its own PMT bearing a unique PID value. The PAT may be decoded in order to determine which PID contains the desired program's PMT. The PAT may function as the master PSI table with PID value that may always be equal to zero (0). In a case where the PAT cannot be found and decoded in the TS, no programs may be available for presentation.

The PSI table may be refreshed periodically at a rate that is fast enough to allow a set-top box to go through program recovery and decompression processes. This may be necessary to ensure real-time user interaction. The PSI may also be used to determine the accuracy and consistency of PSI contents. Notwithstanding, during programs changes or modification of multiplexer provisioning, there may be packets which have a PID value present in the TS, but have no corresponding reference in the PSI. Additionally, the PSI may have references to one or more packets in the PID that are not present in the TS.

In MPEG compliant systems, audio/video services may be carried using some or all of the 188 bytes of the transport packets 100. The transport packets 100 may have one or more stuffing bytes 144 to bring the transport packet size to 188 bytes. Multiple services may be differentiated using a packet identifier (PID) contained in a packet header called the transport packet header. Transport packets from various services may be multiplexed and transmitted on the same physical medium. Exemplary media may comprise, copper, coaxial cable, wireless, optical and any combination thereof. On the receiver side transport packets may be de-multiplexed and data may be separated for each service. For example, audio packets may be separately de-multiplexed from video packets.

Transport packets 100 may comprise a 4-byte header 102, which may comprise an optional adaptation field 122, and a packet payload 104. The packet payload 104 may not be altered by multiplexing or transmitting equipment, except during processing which may comprise data encryption and decryption. In general, encryption may be done once within a typical MPEG processing system. Notwithstanding, some fields of the adaptation field 122 may be changed by multiplexing, for example. Typically, packet order within a PID channel may be maintained from a MPEG encoder to a MPEG decoder, but packet order among multiple PID streams may not be guaranteed during transmission by any transmitting equipment. In cases where co-relation of packets from different PIDs may be required, packet position in a stream may not be utilized since packet order among multiple PID channels may be altered.

Figure 2A:
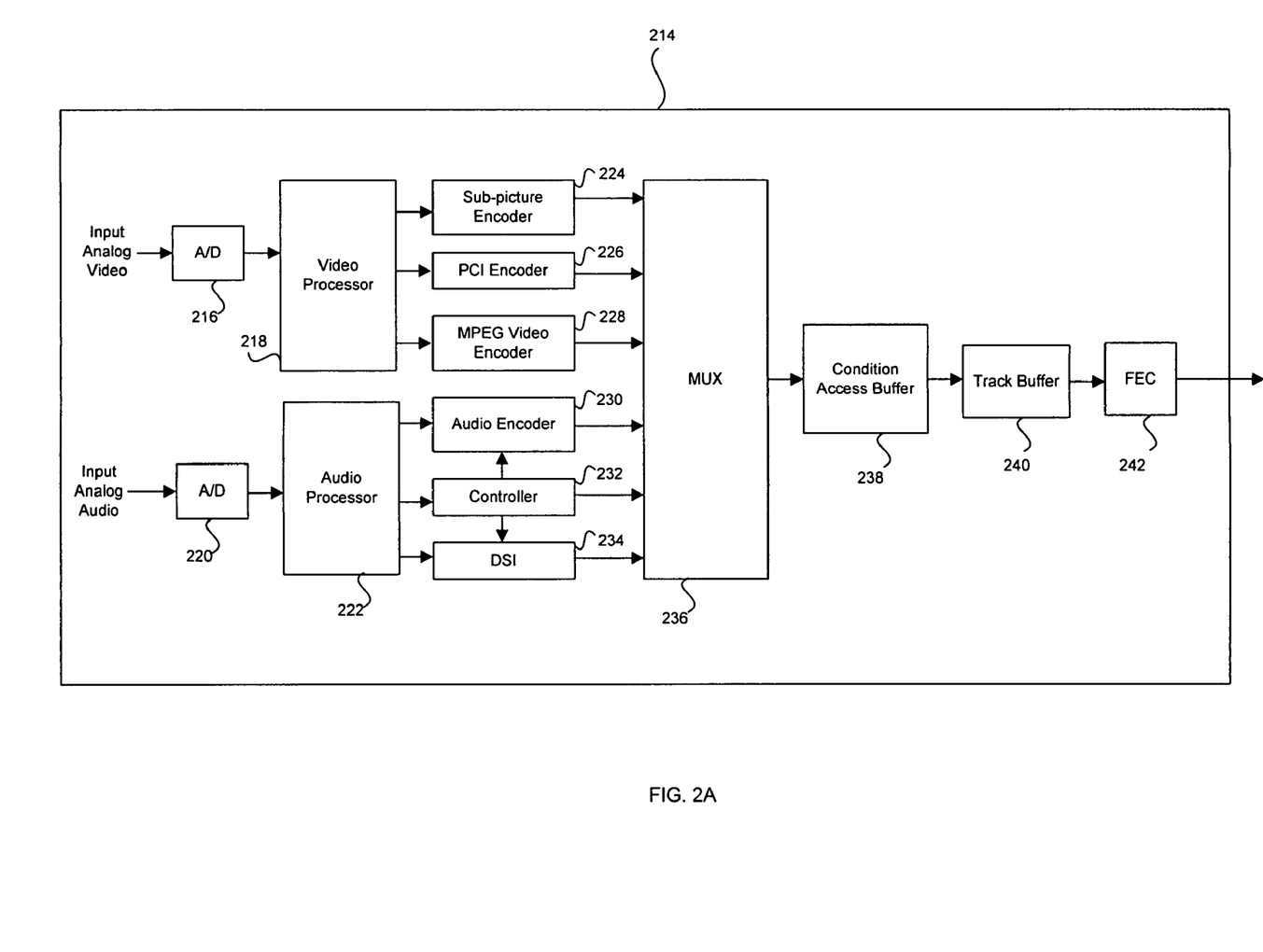
FIG. 2A is a block diagram of an exemplary MPEG encoding system, which may be utilized in connection with an embodiment of the invention.

FIG. 2A is a block diagram of an exemplary MPEG encoding system, which may be utilized in connection with an embodiment of the invention. Referring to FIG. 2A, the MPEG encoding system 214 may encode analog audio and analog video input signals to digital audio and digital video signals, respectively. The analog video input signal may be converted to digital format by A/D converter 216. An output signal from the A/D converter 216 may be communicated to video processor 218 for processing. After the video processor 218 processes the signal, the output signal generated from the video processor 218 may be sent to a sub-picture encoder 224 for processing. A presentation control information (PCI) encoder 226 may be configured to encode PCI data for the video signal processed by video processor 218. The output signal generated from the video processor 218 may also be received and processed by a MPEG video encoder 228 which may be configured to format the video signal in MPEG format.

An analog input audio signal may be converted to digital format by A/D converter 220. An output signal from the A/D converter 220 may be communicated to audio processor 222 for processing. After the audio processor 222 processes the signal, the output signal generated from the audio processor 222 may be sent to an audio encoder 230 to be encoded in a suitable format. A data search information (DSI) encoder 234 may be configured to encode indexing and search data for the audio signal processed by audio processor 222. The outputs from the sub-picture encoder 224, PCI encoder 226, MPEG video encoder 228, audio encoder 230 and DSI encoder 234 may be multiplexed into a single data stream, by multiplexer 236. A controller 232 may be configured to control the operations of audio encoder 230, DSI encoder 234 and multiplexer (MUX) 236. The output of the MUX 236 may comprise a single steam, which may contain various kinds of PES. The PES may comprise, audio, video, PCI, DSI and sub-picture information.

The MPEG encoding system 214 may also comprise a conditional access buffer 238 that may be configured to control propagation of the packets through the MUX 236. A track buffer 240 may be used to buffer and assemble data packets for further processing. Finally, the assembled packets may be encoded with a forward error correction algorithm within a forward error correction block (FEC) 242 for transmission over a channel. The output of the FEC block 242 may be a MPEG formatted digital audio/video signal.

Figure 2B:
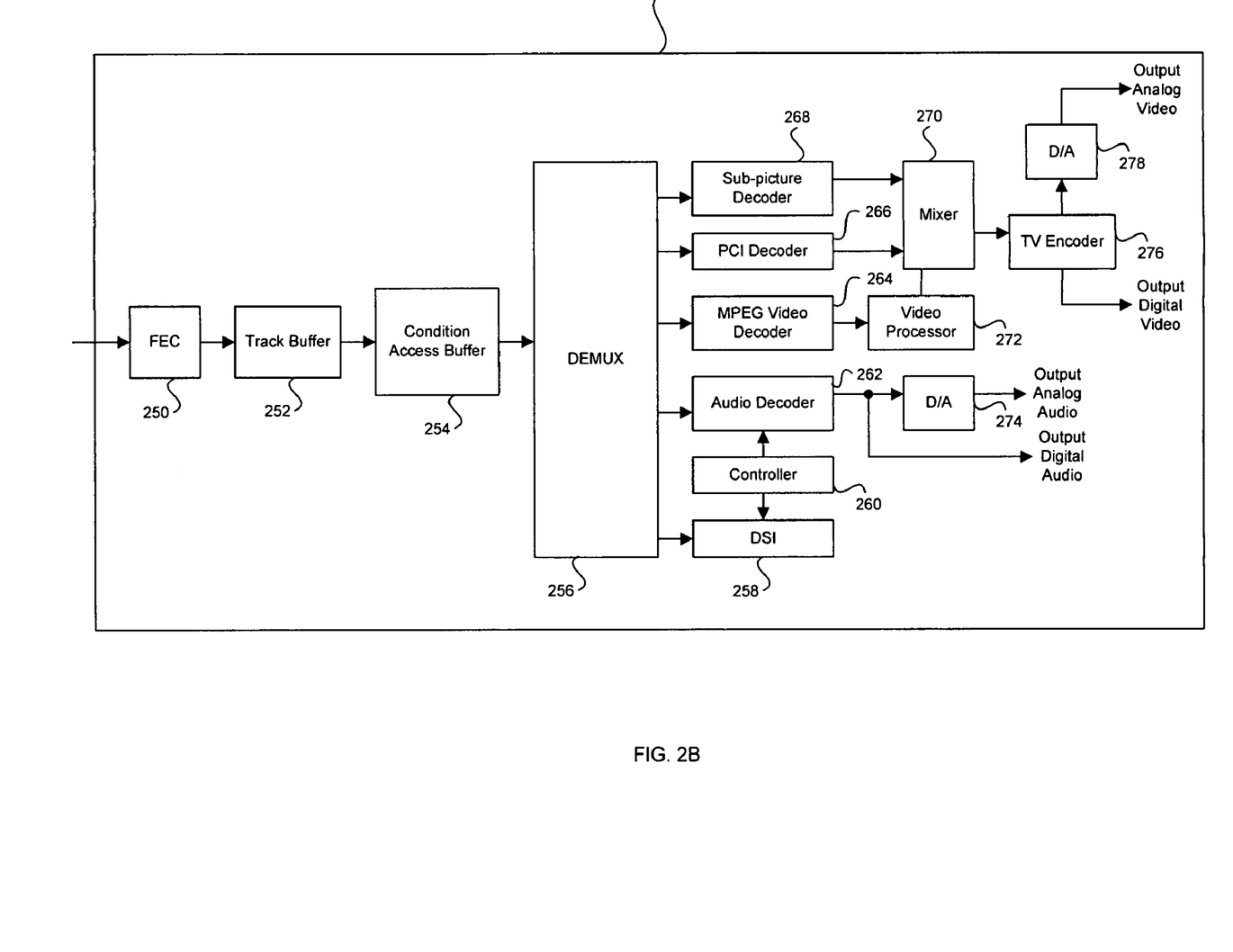
FIG. 2B is a block diagram of an exemplary MPEG decoding system, which may be utilized in connection with an embodiment of the invention.

FIG. 2B is a block diagram of an exemplary MPEG decoding system, which may be utilized in connection with an embodiment of the invention. The MPEG decoding system 248 may be, for example, a set-top box. Referring to FIG. 2B, MPEG decoding system 248 may comprise a forward error correction processing block 250 and a track buffer 252. The track buffer 252 may be used to buffer and assemble data packets for further processing. The packets may be processed by a conditional access circuit 254 that may be configured to control propagation of the packets through de-multiplexer (DEMUX) 256 and into respective video and audio processing paths. The output of the DEMUX 256 may comprise various kinds of packetized elementary streams (PES), including audio, video, presentation control information (PCI), sub-picture information, and data search information (DSI) streams. The de-multiplexed PCI in the PES may be buffered prior to being decoded by PCI decoder 266.

The sub-picture information in the PES may be buffered and decoded by sub-picture decoder 268. The de-multiplexed video stream in the PES may be decoded by MPEG video decoder 264. Video processor 272 may be configured to process the output from the MPEG video decoder 264. Video processor 272 may be a microprocessor or an integrated circuit (IC). Subsequent to processing of the MPEG video, mixer 270 may combine the outputs of the PCI decoder 266, the video processor 264 and the sub-picture decoder 268 to form a composite video signal. The output of mixer 270 may thereafter be encoded in a conventional television signal format such as PAL, SECAM, or NTSC by the TV encoder 276. The output of the TV encoder 276 may be a digital video signal. However, D/A converter 278 may convert this digital video output signal to an analog video output signal.

The audio portion of the PES may be buffered and decoded by audio decoder 262. The output of the audio decoder 262 may be a digital audio signal. The audio D/A 274 may process digital audio received from the audio decoder 262 and produce an analog audio output signal. Audio decoder 262 may comprise a frame buffer sufficient for temporarily storing audio frames prior to decoding. Controller 260 may control the operation of audio decoder 262 and DSI 258. Controller 260 may be configured to utilize DMA to access to data in track buffer 252 or any other associated memory (not shown).

Program specific information (PSI) comprises MPEG data identifying specific portions of a transport stream belonging to a particular program. Program specific information may be communicated via one or more PSI tables. These PSI tables may comprise a program association table (PAT), a program map table (PMT), a conditional access table (CAT) and a network information table (NIT). The conditional access table may be utilized to identify those PID values in the transport packets that bear entitlement management messages (EMMs). The network information table may be utilized to map information such as channel frequencies and transponder numbers.

While the program association table and program map table may be required by MPEG-2, the conditional access table and the network information table may be optional tables. Entry to the program specific information (PSI) tables may be provided by the program association table, the latter of which is carried in packets bearing a PID of 0 (packet ID=0). Each program may be assigned a program number and for each program number that is assigned, the program association table lists the PID associated with packets containing the corresponding program's program map table (PMT). The PMT generally comprises a listing of the PIDs for packets having various components for a particular program such as audio, video, and program clock reference (PCR). The program association table may also comprise program IDs for one or more network information tables. The NIT may be utilized for identification purposes and may be utilized to map information such as transponder numbers and channel frequencies for programs. Packets bearing a PID of 1 (packet ID=1) may be utilized to carry conditional access tables. The PIDs for entitlement management messages (EMMs) may comprise authorization level information, which may be stored in the conditional access tables located in conditional access buffers.

During decoding, a MPEG decoder may be adapted to read a program access table in order to locate a desired program. Once the desired program is located in the program access table, packets bearing the desired program map table may be demultiplexed. The program map table may then be read to identify those packets that bear the program IDs specified in the program map table. Once the program IDs are read, the corresponding packets may then be demultiplexed in order to generate the associated elemental streams.

Figure 3:
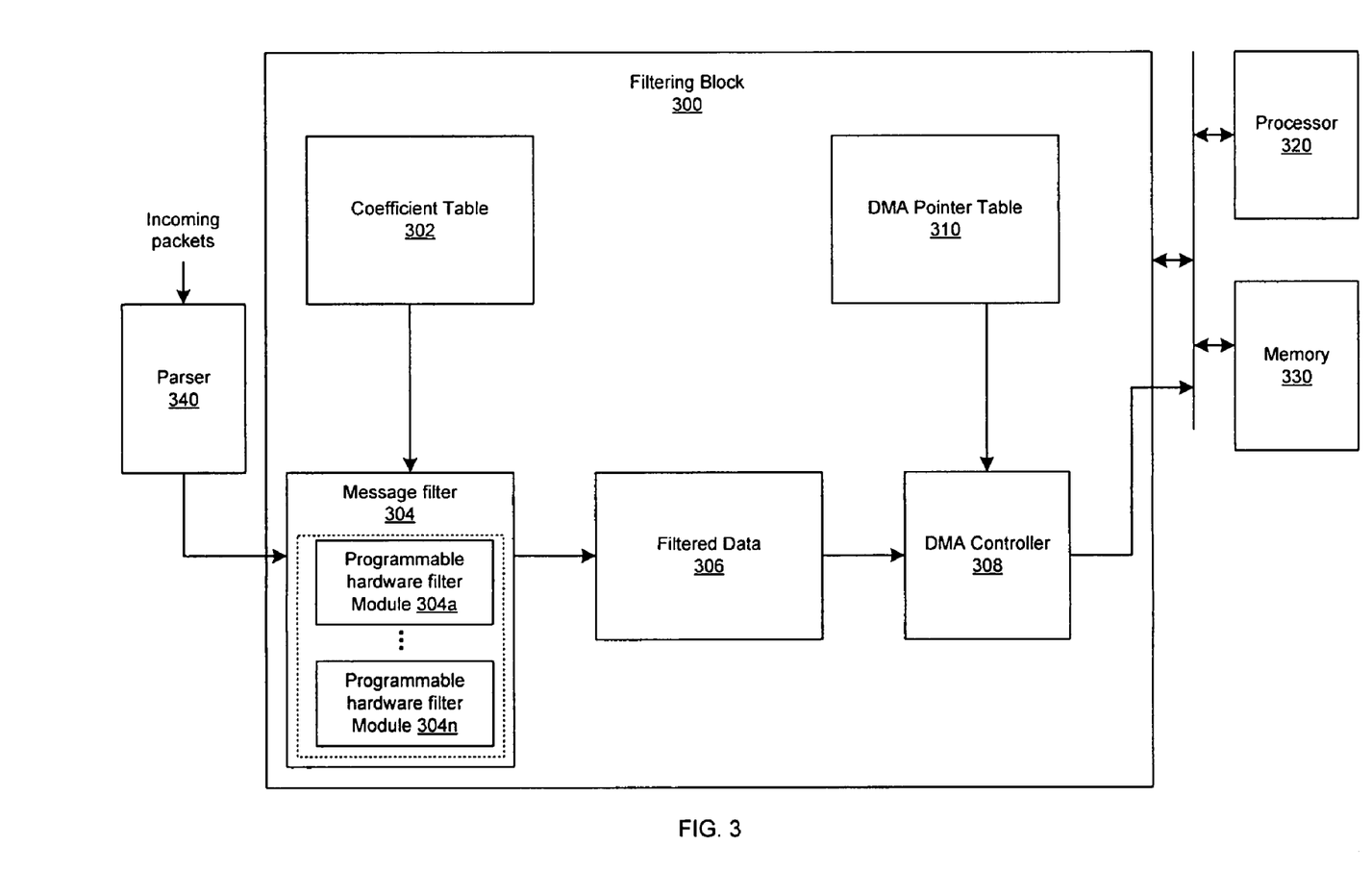
FIG. 3 is a block diagram of an exemplary filtering block, in accordance with an embodiment of the invention.

FIG. 3 is a block diagram of an exemplary filtering block, in accordance with an embodiment of the invention. Referring to FIG. 3, there is shown a filtering block 300, a processor 320, a memory block 330, and a parser block 340. The filtering block 300 may comprise a coefficient table block 302, a message filter block 304, a filtered data block 306, a DMA controller block 308, and a DMA pointer table block 310.

The coefficient table block 302 may comprise suitable logic, circuitry, and/or code that may store a coefficient, an inclusion mask, and an exclusion mask for programmable hardware filter modules 304a, . . . , 304n that may be configured to certain lengths in the message filter block 304. The coefficient may be a bit pattern that may be used by a programmable hardware filter module 304a to compare with incoming data, which may be referred to as messages. The messages may be output by the parser block 340. The inclusion mask and exclusion mask may each be used to mask bits of the coefficient for different compare operations of the programmable hardware filter module 304a. The coefficients, inclusion masks, and the exclusions masks may be written to, for example, the coefficient table 302 by the processor 320.

The coefficient, the inclusion mask, and the exclusion mask may be, for example, the same number of bits for each programmable hardware filter module 304a in the message filter block 304. If the programmable hardware filter modules 304a, . . . , 304n in the message filter block 304 can be configured to different lengths, a length of one programmable hardware filter module 304a may be different than the length of another programmable hardware filter module 304a. The U.S. application Ser. No. 11/313,877, filed on even date herewith, provides a detailed description of the variable length programmable hardware filter module 304a, and is hereby incorporated herein by reference in its entirety. Accordingly, the number of bits for the coefficient, the inclusion mask, and the exclusion mask may be different for one programmable hardware filter module 304a than for another programmable hardware filter module 304n. In some embodiments of the invention, the coefficients, the inclusion masks, and the exclusion masks may be stored in a table in memory. Other exemplary embodiments of the invention may store the coefficients, the inclusion masks, and the exclusion masks in a plurality of registers.

The message filter block 304 may comprise logic, circuitry, and/or code that may be adapted to form programmable hardware filter modules 304a, . . . , 304n for filtering, for example, PSI and/or PES messages. A programmable hardware filter module 304a in the message filter block 304 may compare bits of a message with bits that may result from masking the coefficient with the inclusion mask or the exclusion mask. The inclusion mask may be used for a positive comparison, and the exclusion mask may be used for a negative comparison. A message may be considered to match if both the positive comparison at a programmable hardware filter module 304a and the negative comparison at that programmable hardware filter module 304a produce a match. A programmable hardware filter module 304a may compare data in a message.

Positive comparison may match if all bits of the coefficient that are not masked by the inclusion mask matches corresponding bits in the message. An asserted bit in the inclusion mask may mask a corresponding bit of the coefficient. This may indicate that the corresponding bit need not be compared. If the inclusion mask is such that no bits are to be compared, then all messages will match. Negative comparison may match if any bit of the coefficient that is not masked by the exclusion mask is not the same as a corresponding bit in the message. An asserted bit in the exclusion mask may mask a corresponding bit of the coefficient. This may indicate that the corresponding bit need not be compared. If the exclusion mask is such that no bits are to be compared, then all messages will match.

A programmable hardware filter module 304a in the message filter block 304 may compare bits of a message with corresponding bits of the coefficient that may be not be masked by the inclusion mask or the exclusion mask. A message may be considered to match if both the positive comparison and the negative comparison at a programmable hardware filter module 304a produce matches. The programmable hardware filter module 304a may compare data starting at a byte offset from the start of a message, where the byte offset may be variable for the programmable hardware filter modules 304a, . . . , 304n. For example, the processor 320 may program the byte offsets appropriately for the programmable hardware filter modules 304a, . . . , 304n.

The filtered data block 306 may comprise memory and/or registers that may be used to store filtered data from the message filter block 304. The DMA controller block 308 may be a standardized DMA controller, which may be utilized to control direct memory transfer of filtered data to a memory such as the memory block 330. The DMA pointer table block 310 may comprise memory and/or registers that may store information needed for DMA transfers of the filtered data. The DMA information may comprise, for example, start address of the memory block 330 to transfer the data to, and the number of bytes of data to transfer. The DMA information may be written by, for example, the processor 320. The PSI parser block 340 may comprise suitable logic, circuitry and/or code that may enable parsing of an incoming transport stream. Accordingly, various portions of an incoming data stream may be parsed and only the required portions of the parsed data stream may be filtered by the filtering block 300.

In operation, the parser block 340 may receive incoming data packets for a data stream, and may parse the data packets. The resulting parsed data packets, which may be referred to as messages, may comprise information needed for decoding data for the data stream. The message filter block 304 may use for example, up to 32 of the programmable hardware filter modules 304a, . . . , 304n for each PID channel. The PID associated with the message may determine the programmable hardware filter modules that may be used to filter the message. If any of the programmable hardware filter modules 304a, . . . , 304n associated with the PID matches the message with the filter coefficient, that message may be stored in the filtered data block 306.

For example, two of the programmable hardware filter modules 304a, . . . , 304n associated with a specific PID may filter a message with that PID. One programmable hardware filter module 304a may be associated with video data stream for that channel and another programmable hardware filter module 304n may be associated with audio data stream for that channel. If the audio data filter matches the message, the message may be saved. Similarly, if the video data filter matches the message, the message may also be saved. If any programmable hardware filter module fails to match a message, that filter module may ignore that message.

The filtering may comprise positive comparison and negative comparison of the message from the parser block 340. The programmable hardware filter modules 304a, . . . , 304n may make comparisons using the corresponding coefficient, inclusion mask, and exclusion mask from the coefficient table 302. If a message matches the positive comparison and the negative comparison, then the message may be communicated to the filtered data block 306. The messages in the filtered data block 306 may be DMA transferred to the memory block 330 by the DMA controller block 308. The DMA controller block 308 may use appropriate DMA information in the DMA pointer table block 310. Accordingly, each of the programmable hardware filter modules 304a, . . . , 304n min the message filter block 304 may select specific messages, for example, audio messages or video messages, for a specific channel.

Some filter designs may comprise a number of hardware filter modules that compare data from the beginning of a message. For example, a hardware filter module may be 16 bytes long, and a 4-byte data that may be the 15th through 18th bytes with respect to the beginning of the message may be desired to be filtered. Accordingly, the 16-byte filter may only be able to filter two of the 4-byte data that is desired to be filtered. This may occur because the first 16 bytes of the message may be filtered, which may include only the first two bytes of the 4-byte data. Accordingly, the processor 320 may need to filter the last two bytes of the 4-byte data. Similarly, if the same type of filter is to filter the 21st through the 24th bytes of data with respect to the beginning of the message, none of the four bytes of data will be filtered. Accordingly, the processor 320 may need to filter all four bytes.

However, these disadvantages may be alleviated by the programmable hardware filters modules 304a, . . . , 304n with programmable offsets, in accordance with an embodiment of the invention. The offset for each of the programmable hardware filters 304a, . . . , 304n may be programmed by, for example, the processor 320. An advantage of programmable hardware filter modules 304a, . . . , 304n with programmable offsets may be that hardware components in the message filter block 304 may be more efficiently used.

Figure 4A:
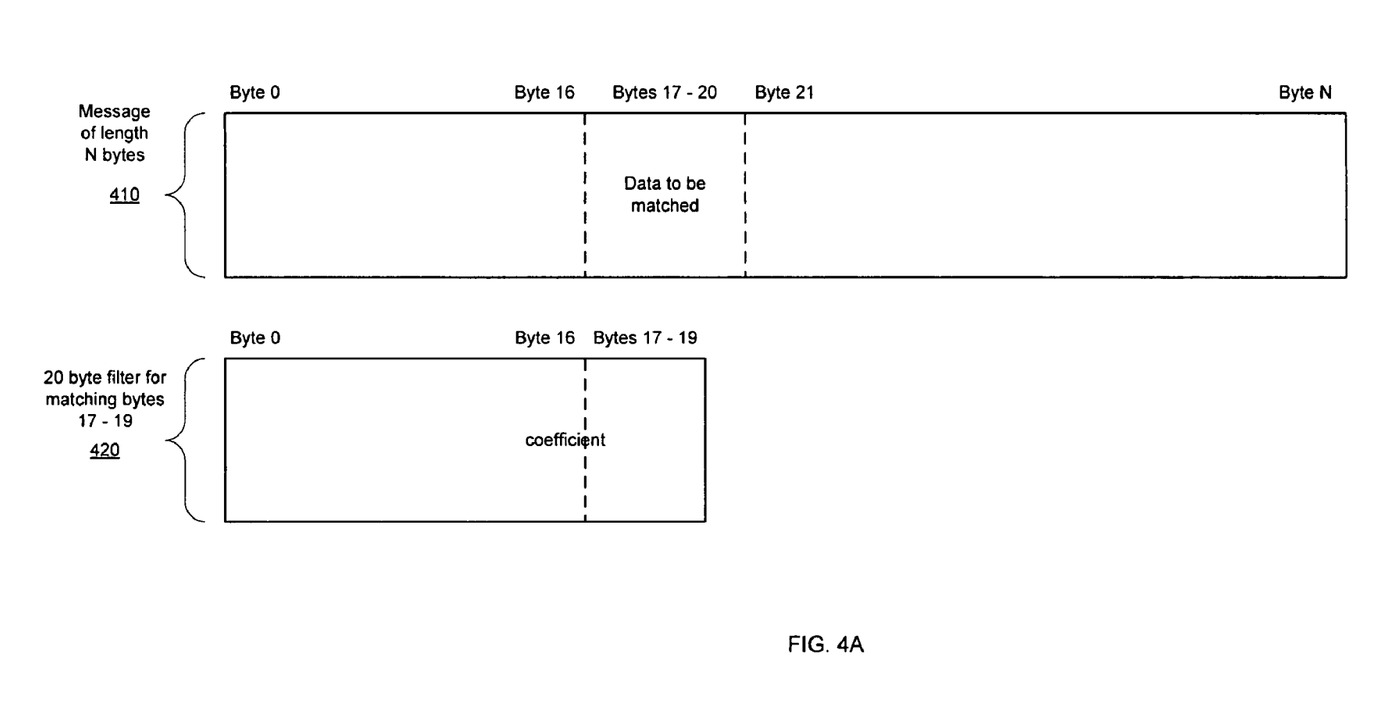
FIG. 4A is a diagram of a message filtered from a beginning of the message, which may be utilized in connection with an embodiment of the invention.

FIG. 4A is a diagram of a message filtered from a beginning of the message, which may be utilized in connection with an embodiment of the invention. Referring to FIG. 4A, there is shown a N-byte message 410, where N may be greater than 20, and a 20-byte filter 420. Four bytes of the N-byte message 410, for example, the bytes 17-20, may be desired to be filtered. However, since the message may be filtered from the first byte, the 20-byte filter 420 may be aligned with the first byte of the N-byte message 410. Accordingly, the inclusion mask and the exclusion mask may have all bits asserted that correspond to the first 17 bytes, bytes 0-16, of the N-byte message 410. In this manner, the 20-byte filter 420 may not compare the bits in the first 17 bytes of the N-byte message 410 with the bits in the first 17 bytes of the 20-byte coefficient.

The last three bytes of the 20-byte filter 420 may be aligned with the first three bytes of the data to be filtered, for example, the bytes 17-19. Specific bits in the last three bytes of inclusion mask and/or the exclusion mask may be asserted. This may be because the corresponding bits in the N-byte message 410 may not need to be compared, for example, since they may be reserved bits that may not be used. Accordingly, the 20-byte filter 420 may compare the unmasked bits of the last three bytes of the coefficient with the corresponding bits in the bytes 17-19 of the N-byte message 410. However, byte 20 of the N-byte message 410, the $21^{st}$ byte, may not be filtered by the 20-byte filter 420 since it may not be large enough to encompass the $21^{st}$ byte of the N-byte message 410. Since byte 20 of the N-byte message 410 may not be filtered, the processor 320 may need to filter byte 20 of the N-byte message 410.

Figure 4B:
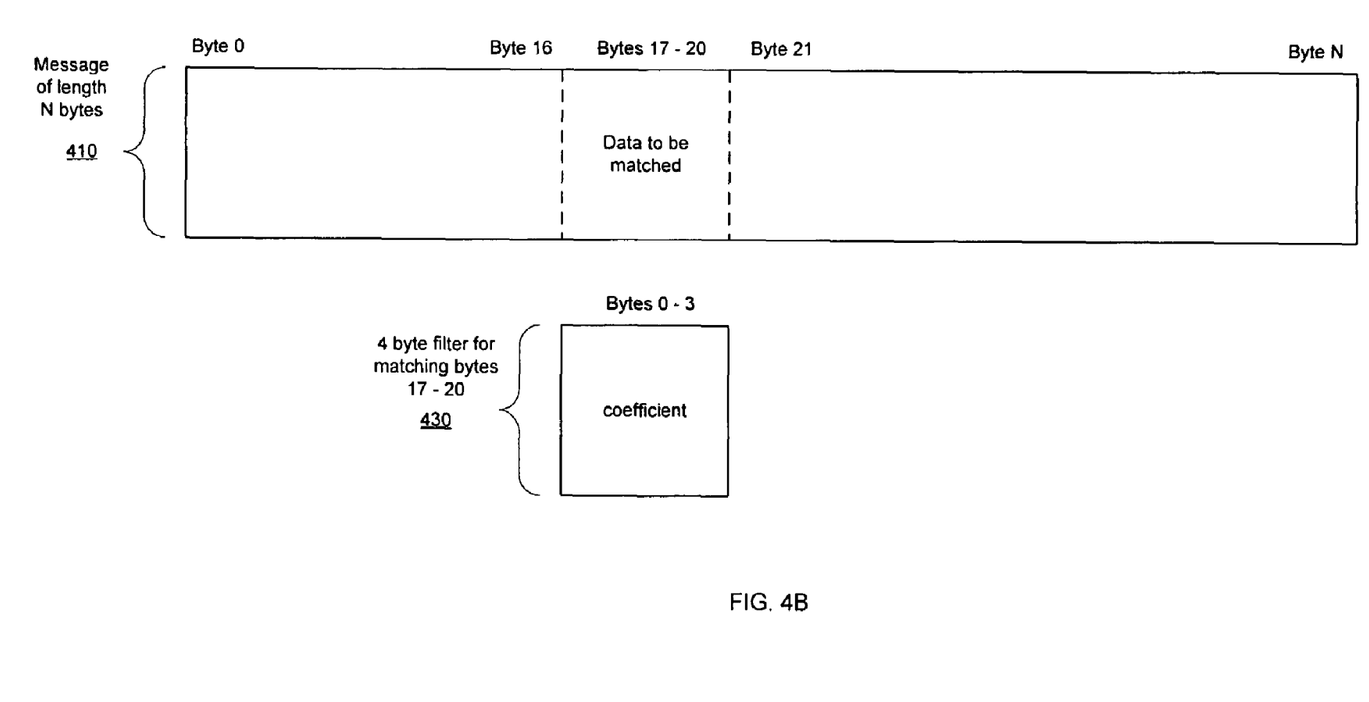
FIG. 4B is a diagram of a message filtered by a variable offset filter, in accordance with an embodiment of the invention.

FIG. 4B is a diagram of a message filtered by a variable offset filter, in accordance with an embodiment of the invention. Referring to FIG. 4B, there is shown a N-byte message 410, where N may be greater than 20, and a 4-byte programmable hardware filter module 430. The programmable hardware filter module 430 may be, for example, one of the programmable hardware filter modules 304a, . . . , 304n. Four bytes of the N-byte message 410, for example, the bytes 17-20, may be desired to be filtered. The offset for the 4-byte programmable hardware filter module 430 may have been programmed to be 17. The offsets for the programmable hardware filter modules 304a, . . . , 304n in the message filter block 304 may be programmed, or written, for example, in the coefficient table block 302. The 4-byte programmable hardware filter module 430 may be aligned with the 18th byte of the N-byte message 410. Accordingly, the 4-byte programmable hardware filter module 430 may be aligned with all four bytes of the N-byte message 410 that may be desired to be filtered. Since the programmable hardware filter module 430 is 4 bytes in length, the coefficient, the inclusion mask, and the exclusion mask may also be 4 bytes in length.

Specific bits in the four bytes of inclusion mask and/or the exclusion mask may be asserted. This may be because the corresponding bits in the N-byte message 410 may not need to be compared, for example, because they may be reserved bits that may not be used. Accordingly, the 4-byte programmable hardware filter module 430 may compare the unmasked bits of the 4-byte coefficient with the corresponding bits in the bytes 17-20 of the N-byte message 410. In this manner, programmable hardware filter module may be used efficiently by programming the variable offsets for the filters to align beginning of the filters with the beginning of the data to be filtered.

Although the offsets for the programmable hardware filter modules 304a, . . . , 304n may have been described as being programmed in the coefficient table block 302, the invention need not be so limited. For example, the offsets may be programmed in the message filter block 304, or in another functional portion of the filtering block 300. Additionally, while some embodiments of the invention may have offsets in increments of bytes, the invention need not be so limited. Other embodiments of the invention may have, for example, offsets in increments of a single bit or multiple bits.

Figure 5:
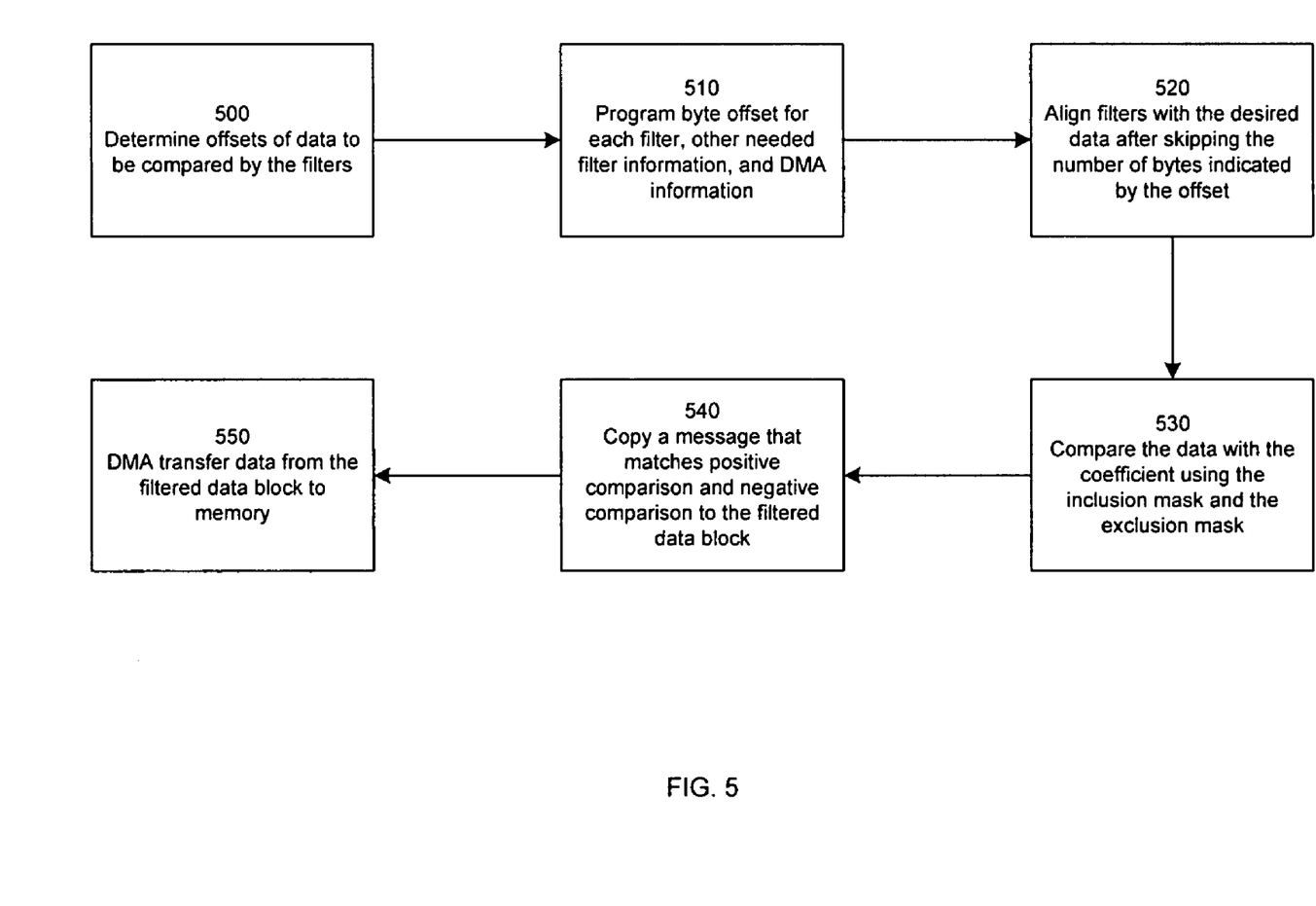
FIG. 5 is a flow chart illustrating exemplary steps for using hardware filters with variable offsets to filter messages, in accordance with an embodiment of the invention.

FIG. 5 is a flow chart illustrating exemplary steps for using hardware filters with variable offsets to filter messages, in accordance with an embodiment of the invention. In step 500, data offsets for the data to be compared may be determined for each programmable hardware filter module 304a, . . . , 304n that may be used in the message filter block 304. In step 510, the determined offsets and other filter information, such as coefficients, inclusion mask and exclusion mask, as well as DMA information may be programmed for each of the programmable hardware filter module 304a, . . . , 304n in the filter block 304. In step 520, a programmable hardware filter module may be aligned with data in a message to be filtered according to the offset programmed for that filter. In step 530, the data in the message may be compared to a corresponding coefficient, with appropriate masking by the inclusion mask or the exclusion mask. In step 540, a message that matches positive comparison and negative comparison may be stored in the filtered data block 306. In step 550, at least a portion of the messages in the filtered data block 306 may be DMA transferred to memory.

Referring to FIG. 5, in step 500, a processor, for example, the processor 320, may determine offsets needed for the programmable hardware filter module 304a, . . . , 304n needed for an application. The offset may be used by each of the programmable hardware filter modules 304a, . . . , 304n to align the programmable hardware filter module with appropriate starting byte of data to be compared. For example, if the offset is determined to be five bytes for a data stream, a programmable hardware filter module may compare data from the sixth byte of the start of the message. The offset corresponding to a programmable hardware filter module for an application may be, for example, stored in the memory block 330 as part of system information.

In step 510, the processor 320 may program the offset information to, for example, the coefficient table block 302. The processor 320 may also program filter information and DMA information. The filter information, which may comprise, for example, a coefficient, an inclusion mask, and an exclusion mask for each programmable hardware filter module, may be stored in the coefficient table 302 for use by the message filter block 304. The coefficient and the masks may be used to identify various streams of a channel. For example, one programmable hardware filter module may be utilized to match all video stream messages of a channel, and another programmable hardware filter module may be utilized to match all audio stream messages of that same channel.

The programmable hardware filter modules 304a, . . . , 304n may be allocated based on the PID of a channel stream.

Accordingly, packets from each channel stream, which may comprise audio stream and video stream, for example, may have a PID of a particular channel. The packets may be parsed by the parser block 340, and the resulting parsed packets, or messages, may be communicated to all programmable hardware filter modules that are allocated to that PID.

The DMA information may comprise destination addresses to which data may be DMA transferred. Some embodiments of the invention may store the destination address in the, for example, DMA pointer table block 310. Some embodiments of the invention may also store the number of bytes to be DMA transferred in, for example, the DMA controller block 308. This information may be communicated by, for example, the message filter block 304 after it matches a message. Accordingly, the data in the messages corresponding to a video stream for a PID channel may be stored together in the memory block 330.

In step 520, the messages to be filtered may be received by appropriate programmable hardware filter modules. The programmable hardware filter modules may be aligned with the data to be compared using the programmed offsets for each programmable hardware filter module. Accordingly, the start of the programmable hardware filter module may align with the start of the data that is to be compared. The offset may be different for each programmable hardware filter module depending on where the data to be compared may be with respect to the start of the message.

In step 530, the messages may be filtered based on the coefficient, the inclusion mask, and the exclusion mask from the coefficient table block 302. The coefficient may be a pattern of bits, where the number of bits may be the same as the number of bits in the programmable hardware filter module. The inclusion mask may be a mask with the same number of bits as the coefficient, where each asserted bit may indicate a bit that need not be compared with a corresponding bit in the message. The inclusion mask may be used for a positive comparison where a match may require that each bit on the coefficient that is compared equals the corresponding bit in the message. If the inclusion mask is configured so that no bits are compared, then the positive comparison is considered to be a match for all messages.

The exclusion mask may be a mask with the same number of bits as the coefficient, where each asserted bit may indicate a bit that need not be compared with a corresponding bit in the message. The exclusion mask may be used for a negative comparison where a match may require that at least one bit on the coefficient that is compared is not equal the corresponding bit in the message. If the exclusion mask is configured so that no bits are compared, then the negative comparison is considered to be a match for all messages.

In step 540, if the message matches the positive comparison and the negative comparison, the message may be considered to be a match by the programmable hardware filter module. Accordingly, the message may be stored in the filtered data block 306. If a programmable hardware filter module does not match a message, then that message may be ignored by that programmable hardware filter module. In step 550, the DMA controller block 308 may DMA transfer the data in the filtered data block 306 to the memory block 330. Accordingly, for example, all messages that correspond to a stream of a PID channel may be stored together. For example, all messages of a video stream for a specific PID channel may be stored together.

Another embodiment of the invention may provide a machine-readable storage, having stored thereon, a computer program having at least one code section executable by a machine, thereby causing the machine to perform the steps as described above for a programmable hardware filter module with a variable offset.

In accordance with an embodiment of the invention, aspects of an exemplary system may comprise a filtering block 300 that enables filtering of desired data. The desired data may be located at variable offsets from a start of particular messages in data streams. The processor 320 may enable determining of an offset from the start of the particular message, where the desired data may start at the offset. The processor 320 may also enable configuring of the programmable hardware filter module with the determined offset by storing the variable offset in a table in memory.

A message filter block 304 in the filtering block 300 may comprise programmable hardware filter modules 304a, ..., 304n where the programmable hardware filter modules may be configured to start filtering from an offset that corresponds to the start of the desired data. Each of the programmable hardware filter modules 304a, ..., 304n may be a variable length filter where a length of the variable length filter may be configured to be a length of the desired data. The variable length filter may be aligned with the desired data using the variable offset. Alternatively, any of the programmable hardware filter modules 304a, ..., 304n may be a fixed length filter where the fixed length filter may be aligned with the desired data using the variable offset. The variable offset may be specified by bytes or by bits.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will comprise all embodiments falling within the scope of the appended claims.

What is claimed is:

1. A method for processing messages in a data stream, the method comprising:
 filtering desired data located at a variable offset from a start of a particular message in a data stream using a programmable hardware filter module, wherein said programmable hardware filter module is operable to:
  start said filtering only from an offset corresponding to said start of said desired data; and
  utilize both an inclusion mask and an exclusion mask for matching during said filtering.

2. The method according to claim 1, wherein said programmable hardware filter module is a variable length filter.

3. The method according to claim 2, wherein a length of said variable length filter is configured to be a length of said desired data, and said variable length filter is aligned with said desired data using said variable offset.

4. The method according to claim 1, wherein said programmable hardware filter module is a fixed length filter.

5. The method according to claim 4, wherein said fixed length filter is aligned with said desired data using said variable offset.

6. The method according to claim 1, comprising determining an offset from said start of said particular message, wherein said desired data starts at said offset.

7. The method according to claim 6, comprising configuring said programmable hardware filter module with said determined offset.

8. The method according to claim 1, wherein said variable offset is specified by bytes.

9. The method according to claim 1, wherein said variable offset is specified by bits.

10. The method according to claim 1, wherein at least one said variable offset is stored in a table in memory.

11. A machine-readable storage having stored thereon, a computer program having at least one code section for processing messages in a data stream, the at least one code section being executable by a machine for causing the machine to perform steps comprising:
 filtering desired data located at a variable offset from a start of a particular message in a data stream using a programmable hardware filter module, wherein said programmable hardware filter module is operable to:
  start said filtering only from an offset corresponding to said start of said desired data; and
  utilize both an inclusion mask and an exclusion mask for matching during said filtering.

12. The machine-readable storage according to claim 11, wherein said programmable hardware filter module is a variable length filter.

13. The machine-readable storage according to claim 12, wherein a length of said variable length filter is configured to be a length of said desired data, and said variable length filter is aligned with said desired data using said variable offset.

14. The machine-readable storage according to claim 11, wherein said programmable hardware filter module is a fixed length filter.

15. The machine-readable storage according to claim 14, wherein said fixed length filter is aligned with said desired data using said variable offset.

16. The machine-readable storage according to claim 11, comprising code for determining an offset from said start of said particular message, wherein said desired data starts at said offset.

17. The machine-readable storage according to claim 16, comprising code for configuring said programmable hardware filter module with said determined offset.

18. The machine-readable storage according to claim 11, wherein said variable offset is specified by bytes.

19. The machine-readable storage according to claim 11, wherein said variable offset is specified by bits.

20. The machine-readable storage according to claim 11, wherein at least one said variable offset is stored in a table in memory.

21. A system for processing messages in a data stream, the system comprising a programmable hardware filter module that enables filtering of desired data located at a variable offset from a start of a particular message in a data stream, wherein said programmable hardware filter module is operable to:
   start said filtering only from an offset corresponding to said start of said desired data; and
   utilize both an inclusion mask and an exclusion mask for matching during said filtering.

22. The system according to claim 21, wherein said programmable hardware filter module is a variable length filter.

23. The system according to claim 22, wherein a length of said variable length filter is configured to be a length of said desired data, and said variable length filter is aligned with said desired data using said variable offset.

24. The system according to claim 21, wherein said programmable hardware filter module is a fixed length filter.

25. The system according to claim 24, wherein said fixed length filter is aligned with said desired data using said variable offset.

26. The system according to claim 21, comprising a processor that enables determining of an offset from said start of said particular message, wherein said desired data starts at said offset.

27. The system according to claim 26, wherein said processor enables configuration of said programmable hardware filter module with said determined offset.

28. The system according to claim 21, wherein said variable offset is specified by bytes.

29. The system according to claim 21, wherein said variable offset is specified by bits.

30. The system according to claim 21, wherein at least one said variable offset is stored in a table in memory.

* * * * *

UNITED STATES PATENT AND TRADEMARK OFFICE
CERTIFICATE OF CORRECTION

| | | |
|---|---|---|
| PATENT NO. | : 7,668,270 B2 | Page 1 of 1 |
| APPLICATION NO. | : 11/313531 | |
| DATED | : February 23, 2010 | |
| INVENTOR(S) | : Ut T. Nguyen | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 938 days.

Signed and Sealed this
Twenty-ninth Day of March, 2011

David J. Kappos
*Director of the United States Patent and Trademark Office*